(12) United States Patent
Schmid et al.

(10) Patent No.: US 7,906,274 B2
(45) Date of Patent: Mar. 15, 2011

(54) METHOD OF CREATING A TEMPLATE EMPLOYING A LIFT-OFF PROCESS

(75) Inventors: Gerard M. Schmid, Austin, TX (US); Douglas J. Resnick, Austin, TX (US); Michael N. Miller, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 479 days.

(21) Appl. No.: 11/943,907

(22) Filed: Nov. 21, 2007

(65) Prior Publication Data

US 2009/0130598 A1     May 21, 2009

(51) Int. Cl.
*G03F 7/00* (2006.01)
*G03F 7/09* (2006.01)
*G03F 7/26* (2006.01)
*G03F 7/40* (2006.01)

(52) U.S. Cl. ............ 430/322; 430/5; 430/312; 430/316; 430/317; 430/318; 430/331; 430/311

(58) Field of Classification Search .................. 430/311, 430/312, 5, 316, 317, 318, 322, 331
See application file for complete search history.

(56) References Cited

U.S. PATENT DOCUMENTS

| | | |
|---|---|---|
| 3,677,178 A | 7/1972 | Gipe |
| 4,190,488 A | 2/1980 | Winters |
| 4,201,800 A | 5/1980 | Alcorn et al. |
| 4,498,953 A | 2/1985 | Cook et al. |
| 5,348,616 A | 9/1994 | Hartman et al. |
| 5,817,376 A | 10/1998 | Everaerts et al. |
| 5,853,446 A | 12/1998 | Carre et al. |
| 5,885,514 A | 3/1999 | Tensor |
| 5,952,127 A | 9/1999 | Yamanaka |
| 6,051,345 A | 4/2000 | Huang |
| 6,207,570 B1 | 3/2001 | Mucha |
| 6,251,207 B1 | 6/2001 | Schultz et al. |
| 6,274,393 B1 | 8/2001 | Hartswick |
| 6,284,653 B1 | 9/2001 | Tseng |

(Continued)

FOREIGN PATENT DOCUMENTS

EP     1460738 A2     9/2004

(Continued)

OTHER PUBLICATIONS

PCT/US2008/12637 International Search Report, Jan. 12, 2009.

(Continued)

*Primary Examiner* — Amanda C. Walke
(74) *Attorney, Agent, or Firm* — Heather L Flanagan; Fish & Richardson P.C.

(57) ABSTRACT

A method of forming a lithographic template, the method including, inter alia, creating a multi-layered structure, by forming, on a body, a conducting layer, and forming on the conducting layer, a patterned layer having protrusions and recessions, the recessions exposing portions of the conducting layer; depositing a hard mask material anisotropically on the multi-layered structure covering a top surface of the patterned layer and the portions of the conducting layer; removing the patterned layer by a lift-off process, with the hard mask material remaining on the portions of the conducting layer; positioning a resist pattern on the multi-layered structure to define a region of the multi-layered structure; and selectively removing portions of the multi-layered structure in superimposition with the region using the hard mask material as an etching mask.

25 Claims, 5 Drawing Sheets

U.S. PATENT DOCUMENTS

| | | | |
|---|---|---|---|
| 6,309,957 B1 | 10/2001 | Tu | |
| 6,334,960 B1 | 1/2002 | Willson et al. | |
| 6,517,977 B2 | 2/2003 | Resnick et al. | |
| 6,696,220 B2 | 2/2004 | Bailey et al. | |
| 6,716,754 B2 | 4/2004 | Hofmann | |
| 6,743,368 B2 | 6/2004 | Lee | |
| 6,753,131 B1 | 6/2004 | Rogers et al. | |
| 6,780,001 B2 | 8/2004 | Eldridge et al. | |
| 6,808,646 B1 | 10/2004 | Jeans | |
| 6,852,358 B1 | 2/2005 | Chen et al. | |
| 6,852,454 B2 | 2/2005 | Mancini et al. | |
| 6,873,087 B1 | 3/2005 | Choi et al. | |
| 6,878,985 B2 | 4/2005 | Arai et al. | |
| 6,890,688 B2 | 5/2005 | Mancini et al. | |
| 6,900,881 B2 | 5/2005 | Sreenivasan et al. | |
| 6,916,584 B2 | 7/2005 | Sreenivasan et al. | |
| 6,919,152 B2 | 7/2005 | Sreenivasan et al. | |
| 6,932,934 B2 | 8/2005 | Choi et al. | |
| 6,936,194 B2 | 8/2005 | Watts | |
| 6,986,975 B2 | 1/2006 | Sreenivasan et al. | |
| 7,027,156 B2 | 4/2006 | Watts et al. | |
| 7,037,639 B2 | 5/2006 | Voisin | |
| 7,070,405 B2 | 7/2006 | Sreenivasan et al. | |
| 7,077,992 B2 | 7/2006 | Sreenivasan et al. | |
| 7,122,482 B2 | 10/2006 | Xu et al. | |
| 7,136,150 B2 | 11/2006 | Sreenivasan et al. | |
| 7,140,861 B2 | 11/2006 | Watts et al. | |
| 7,179,396 B2 | 2/2007 | Sreenivasan | |
| 7,229,273 B2 | 6/2007 | Bailey et al. | |
| 7,279,113 B2 | 10/2007 | Watts et al. | |
| 7,281,921 B2 | 10/2007 | Watts et al. | |
| 7,309,225 B2 | 12/2007 | McMackin et al. | |
| 7,396,475 B2 | 7/2008 | Sreenivasan | |
| 7,547,398 B2 * | 6/2009 | Schmid et al. | 216/83 |
| 2002/0135099 A1 | 9/2002 | Robinson et al. | |
| 2003/0139042 A1 * | 7/2003 | Heidari | 438/689 |
| 2003/0180631 A1 | 9/2003 | Shiota et al. | |
| 2003/0232252 A1 * | 12/2003 | Mancini et al. | 430/5 |
| 2004/0065252 A1 | 4/2004 | Sreenivasan et al. | |
| 2004/0065976 A1 | 4/2004 | Sreenivasan et al. | |
| 2004/0150129 A1 | 8/2004 | Hougham et al. | |
| 2004/0202865 A1 | 10/2004 | Homola et al. | |
| 2005/0064344 A1 | 3/2005 | Bailey et al. | |
| 2005/0084804 A1 | 4/2005 | Truskett et al. | |
| 2005/0098534 A1 | 5/2005 | Sreenivasan et al. | |
| 2005/0158900 A1 | 7/2005 | Lee et al. | |
| 2005/0189676 A1 | 9/2005 | Sreenivasan | |
| 2005/0230882 A1 | 10/2005 | Watts et al. | |
| 2005/0285308 A1 * | 12/2005 | Hattori et al. | 264/293 |
| 2006/0019183 A1 | 1/2006 | Voisin | |
| 2006/0067650 A1 | 3/2006 | Chui | |
| 2006/0113697 A1 | 6/2006 | Sreenivasan | |
| 2006/0266916 A1 | 11/2006 | Miller et al. | |
| 2007/0026324 A1 | 2/2007 | Yoshida et al. | |
| 2007/0026542 A1 | 2/2007 | Sreenivasan et al. | |
| 2007/0122942 A1 | 5/2007 | Sreenivasan et al. | |
| 2007/0247608 A1 | 10/2007 | Sreenivasan et al. | |
| 2008/0095878 A1 | 4/2008 | Bailey et al. | |
| 2008/0292805 A1 * | 11/2008 | Tamura et al. | 427/443.2 |

FOREIGN PATENT DOCUMENTS

| | | |
|---|---|---|
| JP | 61-40845 | 2/1986 |
| WO | WO 01/90816 | 11/2001 |
| WO | WO 02/22916 | 3/2002 |
| WO | 2007117519 | 10/2007 |
| WO | WO2008097278 A3 | 11/2008 |
| WO | WO2009067149 A1 | 5/2009 |

OTHER PUBLICATIONS

Krug et al., Fine Patterning of Thin Sol-gel Films, Journal of Non-Crystalline Solids 147 & 148, pp. 447-450 Jan. 1, 1992.

Resnick et al., High Resolution Templates for Step and Flash Imprint Lithography, Journal of Microlithography, Microfabrication, and Microsystems. vol. 1. No. 3. Oct. 1, 2002.

Abstract of Japanese Patent 61-040845, Feb. 27, 1986.

Thompson et al., Fabrication of Step and Flash Imprint Lithography Templates Using Commercial Mask Processes, SPIE Microlithography Conference Feb. 1, 2003.

Gehoski et al., Indium Tin Oxide Template Development for Step and Flash Imprint Lithography, SPIE Microlithography Conference Feb. 1, 2005.

Dauksher et al., Repair of Step and Flash Imprint Lithography Templates, J. Vac. Sci. Technol. B 22(6), pp. 3306-3311 Nov. 1, 2004.

Resnick et al., Imprint Lithography: Lab Curiosity or the Real NGL?, SPIE Microlithography Conference Feb. 1, 2003.

Mancini et al., Analysis of Critical Dimension Uniformity for Step and Flash Imprint Lithography, SPIE Microlithography Conference Feb. 1, 2003.

Mancini et al., Hydrogen Silsesquioxane for Direct Electron-Beam Patterning of Step and Flash Imprint Lithography Templates, J. Vac. Sci. Technol. B 20(6), pp. 2896-2901 Nov. 1, 2002.

Dauksher et al., Characterization of and Imprint Results Using Indium Tin Oxide-Based Step and Flash Imprint Lithography Templates, J. Vac. Sci. Technol. B 20(6), pp. 2857-2861 Nov. 1, 2002.

Nordquist et al., Critical Dimension and Image Placement Issues for Step and Flash Imprint Lithography Templates, 22nd Annual BACUS Symposium on Photomask Technology, Monterey, CA Sep. 1, 2002.

Bailey et al., Template Fabrication Schemes for Step and Flash Imprint Lithography, Microelectronic Engineering, 61-62, pp. 461-467 Jan. 1, 2002.

Resnick et al., High Resolution Templates for Step and Flash Imprint Lithography, SPIE Microlithography Conference Feb. 1, 2002.

Resnick et al., New Methods for Fabricating Step and Flash Imprint Lithography Templates, NIST-SPIE Conference on Nanotechnology Sep. 1, 2001.

Kirby et al., In-Situ Fabrication of Dialysis Membranes in Glass Microchannels using Laser-induced Phase-Separation Polymerization, MicroTAS 2002, p. 742-744 Jan. 1, 2002.

Translation of Japanese Patent 61-40845, Feb. 1, 1986.

Bien et al., Characterization of Masking Materials for Deep Glass Micromachining, J. Micromech. Microeng. 13 pp. S34-S40 Jan. 1, 2003.

Britten et al., Multiscale, Multifuncation Diffractive Structures We Etched into Fused Silica for High-Laser Damage Threshold Applications, Applied Optics, vol. 37, No. 30 Oct. 20, 1998.

Fletcher et al., Microfabricated Silicon Solid Immersion Lens, Jounral of Microelectromechanical Systems, vol. 10, No. 3 Sep. 1, 2001.

Khandaker et al., Fabrication of Microlens Arrays by Direct Electron Beam Exposure of Photoresist, Pure Appl. Opt. 6, pp. 637-641 Jan. 1, 1997.

Kim et al., Replication Qualities and Optical Properties of UV-moulded Microlens Arrays, J. Phys. D: Appl. Phys. 36; pp. 2451-2456 Jan. 1, 2003.

Kobayashi et al., Batch Bulk-Mircomachined High-Precision Metal-On-Insulator Microspires and Their Application to Scanning Tunneling Microscopy, J. Micromech. Microeng. 14; pp. S76-S81 Jan. 1, 2004.

Konijn et al., Nanoimprint Lithography of Sub-100nm 3D Structures, Microelectronic Engineering 78-79; pp. 653-658 Jan. 1, 2005.

Kunnavakkam et al., Low-cost, Low-loss Microlens Arrays Fabricated by Soft-Lithography Replication Process, Applied Physics Letters, vol. 82, No. 8 Feb. 24, 2003.

Mansell et al., Binary-Optic Smoothing with Isotropic Etching, Applied Optics; vol. 36, No. 20 Jul. 10, 1997.

Waheed et al., Balancing Aerial Image Intensity for Alternating Aperture Phase Shift Masks Using an Isotropic Dry-Etch, Proceedings of SPIE vol. 5130 Apr. 18, 2003.

Sano et al., Submicron Spaced Lens Array Process Technology for a High Photosensitivity CCD Image Sensor, IEEE IEDM Dig.; pp. 283-286 Jan. 1, 1990.

Tsukamoto et al., High Sensitivity Pixel Technology for a ¼ inch PAL 430k pixel IT-CCD, IEE Custom Integrated Circuits Conference Jan. 1, 1996.

International Search Report for Application No. WO2008097278, dated Sep. 12, 2008, 1 page.

Schmid et al., U.S. Appl. No. 11/856,862 entitled "Etch-Enhanced Technique for Lift-Off Patterning," filed Sep. 18, 2007, 23 pages.

* cited by examiner

METHOD OF CREATING A TEMPLATE EMPLOYING A LIFT-OFF PROCESS

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
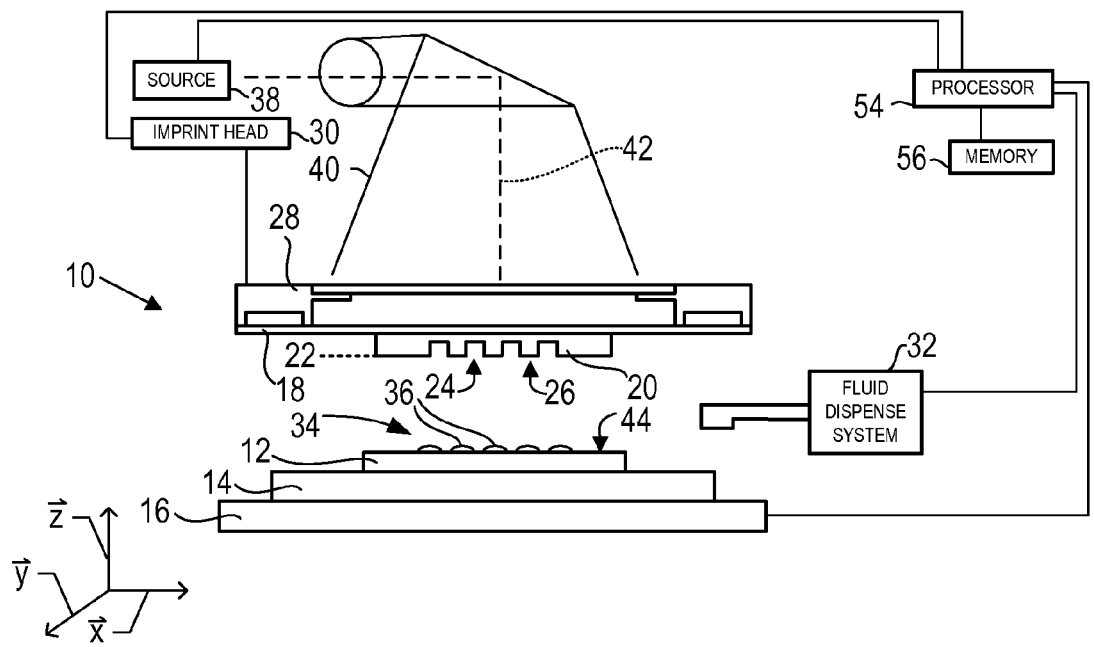
FIG. 1 is a simplified side view of a lithographic system having a mold spaced-apart from a multi-layered structure.

Referring to FIG. 1, a system 10 to form a relief pattern on a substrate 12 is shown. Substrate 12 may be coupled to a substrate chuck 14, described further below. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having a mesa 20 extending therefrom towards substrate 12 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12.

Template 18 may be coupled to a template chuck 28, template chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes" which is incorporated herein by reference. Further, template chuck 28 may be coupled to an imprint head 30 to facilitate movement of template 18, and therefore, mold 20.

System 10 further comprises a fluid dispense system 32. Fluid dispense system 32 may be in fluid communication with substrate 12 so as to deposit polymeric material 34 thereon. System 10 may comprise any number of fluid dispensers, and fluid dispense system 32 may comprise a plurality of dispensing units therein. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymeric material 34 is disposed upon substrate 12 before the desired volume is defined between mold 20 and substrate 12. However, polymeric material 34 may fill the volume after the desired volume has been obtained.

System 10 further comprises a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween that is filled by polymeric material 34. After the desired volume is filled with polymeric material 34, source 38 produces energy 40, e.g., broadband ultraviolet radiation that causes polymeric material 34 to solidify and/or cross-link conforming to the shape of a surface 44 of substrate 12 and patterning surface 22. Source 38 may produce ultraviolet energy. However, other energy sources may be employed, such as thermal, electromagnetic, visible light and the like. The selection of energy employed to initiate polymerization of polymeric material 34 is known to one skilled in the art and typically depends on the specific application which is desired. System 10 may be regulated by a processor 54 that is in data communication with stage 16, imprint head 30, fluid dispense system 32, and source 38, operating on a computer readable program stored in memory 56.

The above-mentioned may be further be employed in an imprint lithography process and system referred to in U.S. Pat. No. 6,932,934 entitled "Formation of Discontinuous Films During an Imprint Lithography Process;" U.S. Pat. No. 7,077,992 entitled "Step and Repeat Imprint Lithography Processes;" and U.S. Pat. No. 7,179,396, entitled "Positive Tone Bi-Layer ImprintLithography Method"; and United States patent application publication 2004/0211754, filed as U.S. patent application Ser. No. 10/432,642, entitled Method of Forming Stepped Structures Employing Imprint Lithography," all of which are incorporated by reference herein.

Figure 2:
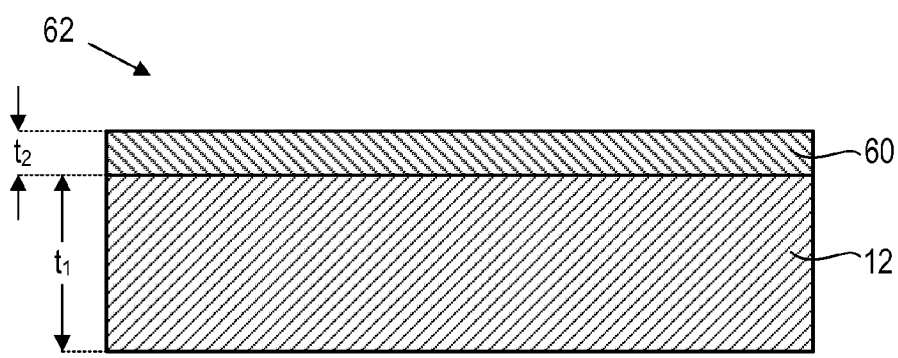
FIG. 2 is a simplified side view of the multi-layered structure shown in FIG. 1 comprising a substrate having a conducting layer positioned thereon.

To that end, referring to FIG. 2, substrate 12 is shown having a conducting layer 60 positioned thereon, defining a multi-layered structure 62. In an embodiment, substrate 12 may be formed from fused silica; however, substrate 12 may be formed from any material. Substrate 12 may have a high quality optical surface with low roughness and defects and further a scratch/dig of 20/10 may be preferred. Substrate 12 may have a thickness $t_1$, with thickness $t_1$ being substantially uniform over substrate 12. In an embodiment, thickness $t_1$ may be less than 1 mm to facilitate flexing/deformation of substrate 12 during processing thereof.

Conducting layer 60 may be formed using any known techniques, e.g., drop dispense, spin-coating, dip coating, chemical vapor deposition (CVD), physical vapor deposition (PVD), and the like. Conducting layer 60 may have a thickness $t_2$ to facilitate etch transfer through the same and be substantially uniform over substrate 12. In an example, thickness $t_2$ may be less than 10 nm and have less than 5 nm roughness. Further, for a given material comprising conducting layer 60, thickness $t_2$ may have a magnitude such that conducting layer 60 may be electroconductive, and thus, dissipate charge during e-beam lithographic exposure. In an example, a sheet resistance of less than 5 kilo-ohms/square is utilized. Further, conducting layer 60 may be etched substantially anisotropically in a suitable dry etch process. It may be further desired that conducting layer 60 be substantially stable after deposition and not prone to chemical or physical transformations, e.g., chemical oxidization or physical de-wetting. It may be further desired that conducting layer 60 is compatible with common cleaning processes, e.g., acid and/or base solution. It may be further desired that conducting layer 60 may be substantially resistant to interfusion or intermixing with substrate 12 or materials positioned thereon, described further below. It may be further desired that conducting layer 60 adhere to substrate 12 and any materials positioned thereon, described further below.

Conducting layer 60 may be formed from materials including, but not limited to, tantalum, tungsten, molybdenum, titanium, tantalum nitride, tungsten nitride, titanium nitride, molybdenum nitride, tantalum silicide, tungsten silicide, titanium silicide, molybdenum silicide, tantalum silicon nitride, tungsten silicon nitride, titanium silicon nitride, and molybdenum silicon nitride. In a further embodiment, conducting layer 60 may be formed from alloy films of the above materials by such methods including, but not limited to, sputtering from an alloy target, reactive sputtering, reactive co-sputtering, and vacuum evaporation techniques. In the present example, conducting layer 60 may be formed from tantalum, and thickness $t_2$ may have a magnitude of 5 nm.

In a further embodiment, conducting layer 60 may be prone to form an undesirable oxide and thus, a capping layer (not shown) may be deposited upon conducting layer 60. The capping layer (not shown) may be formed from silicon and other materials that may form oxides that may be easily etched.

Figure 3:
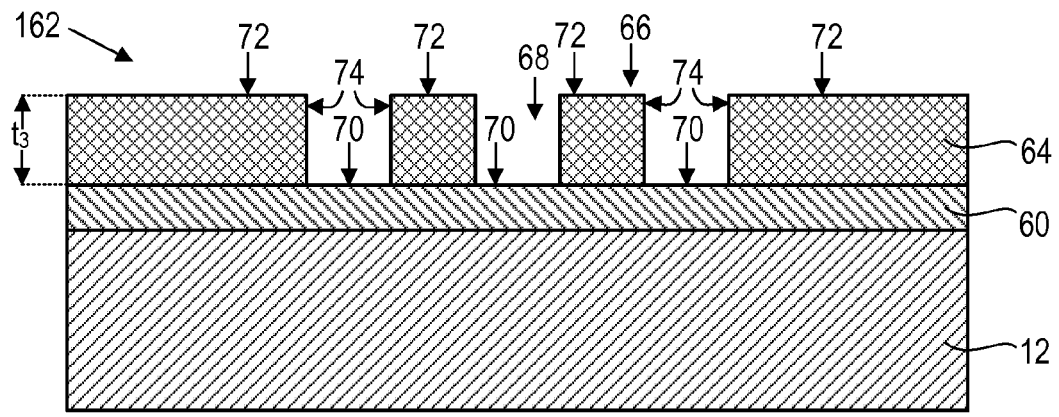
FIG. 3 is a simplified side view of the multi-layered structure shown in FIG. 2 having a patterning layer positioned thereon.

Referring to FIG. 3, a patterning layer 64 may be positioned on conducting layer 60 such that conducting layer 60 is positioned between substrate 12 and patterning layer 64, defining a multi-layered structure 162. Patterning layer 64 may have a plurality of protrusions 66 and recessions 68, with recessions 68 exposing portions 70 of conducting layer 60. Further, protrusions 66 may have a top surface 72 and sidewalls 74. Patterning layer 64 may have a thickness $t_3$ with a magnitude of 45 nm being preferred; however, any thickness may be employed depending on the specific application and desired patterning resolution. Patterning layer 64 may be formed using e-beam lithography. Patterning layer 64 may be a positive-tone electron resist such as ZEP520A available from Nippon Zeon Corporation or 950 k MW poly methyl methacrylate (PMMA) electron beam resist.

In an example, patterning layer 64 may be exposed in an electron beam lithography tool such as a Vistec VB6HR operating at 100 kV, 2 nm beam step grid, and 0.1-1 nA beam current. To that end, a possible exposure pattern may be patterning layer 64 comprising 25 nm diameter dots and on a pitch of 50 nm. One method for developing the ZEP520A resist is immersion in amyl acetate at a temperature of −10 to 10 degrees Celsius for 5 to 120 seconds. One method for developing the PMMA is immersion in a mixture of isopropyl alcohol and water at a temperature of −10 to 10 degrees Celsius for 5 to 120 seconds. It may be possible to employ ultrasonic agitation at 30-50 kHz during development. Further, an anisotropic descum etch maybe employed to remove resist residues from the exposed surfaces of conducting layer 60.

Figure 4:
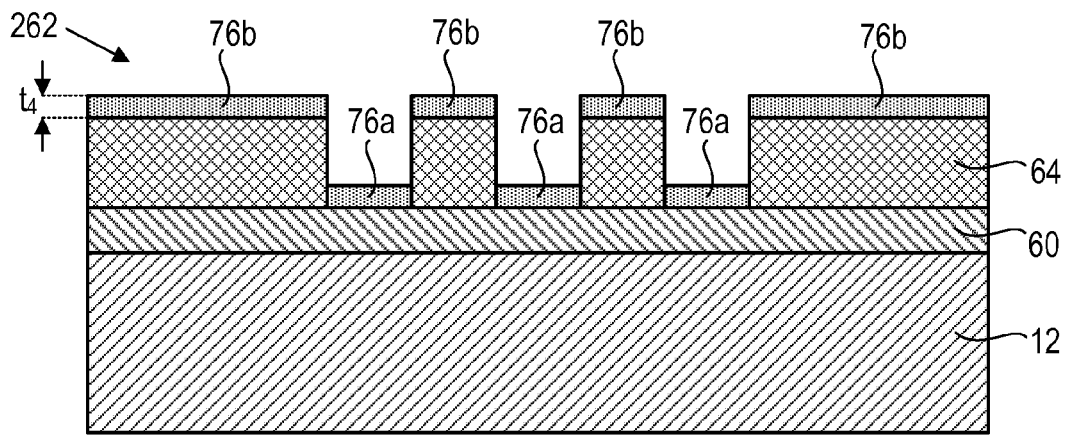
FIG. 4 is a simplified side view of the multi-layered structure shown in FIG. 3 have a hard mask material deposited thereon.
Figure 5:
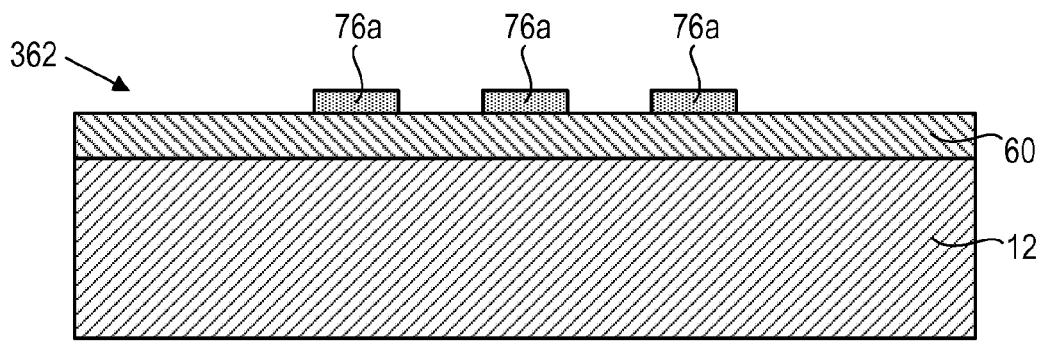
FIG. 5 is a simplified side view of the multi-layered structure shown in FIG. 4 subjected to a lift-off process.

Referring to FIGS. 4 and 5, a lift-off technique may be employed on multi-layered structure 162, shown in FIG. 3. More specifically, etch-enhanced lift-off processing may be employed, as described in U.S. patent application Ser. No. 11/856,862, entitled "Etch-Enhanced Technique for Lift-Off Patterning", which is incorporated herein by reference. To that end, referring to FIG. 4, a hard mask material 76 may be positioned on multi-layered structure 162, shown in FIG. 3, defining multi-layered structure 262. Hard mask material 76a may be deposited directly on portions 70 of conducting layer 60, shown in FIG. 3. Hard mask material 76b may be deposited on surface 72 of patterning layer 64, shown in FIG. 3. In an embodiment, hard mask material 76 may be positioned on multi-layered structure 162, shown in FIG. 3, employing a directional deposition process, such as vacuum evaporation.

Hard mask material 76 may have a thickness $t_4$ of approximately 10 nm and less than 5 nm roughness. Hard mask material 76 may provide selective etching of conducting layer 60 and substrate 12 without significant etching or erosion of hard mask material 76. It may be further desired that hard mask material 76 may be removed from multi-layered structure 262 with high selectively. It may be further desired that hard mask material 76 should adhere to portions 70 of conducting layer 60. It may be further desired that hard mask material 76 be substantially stable after deposition and not prone to chemical or physical transformations, e.g., chemical oxidization or physical de-wetting. It may be further desired that hard mask material 76 is compatible with common cleaning processes, e.g., acid and/or base solution.

Hard mask material 76 may be formed from materials including, but not limited to, chromium, nickel, platinum, or alloys thereof. Chromium may be readily evaporated, is well-suited for isotropic etching, and is a well-known etch mask material for fused silica (substrate 12).

Referring to FIGS. 3 and 4, hard mask material 76 may be positioned upon sidewalls 74 of patterned layer 64, which may be undesirable. To remove hard mask material 76 positioned on sidewalls 74 of patterned layer 64, multi-layered structure 262 may be subjected to an isotropic dry etch. One isotropic dry etch comprises reactive ion etch processing at 30 volts DC (Direct Current) bias with a gas flow rate of 60 sccm $Cl_2$ and 20 sccm $O_2$, at a pressure of 90 mT.

Referring to FIG. 5, to complete the lift-off process, one process comprises immersing multi-layered structure 262, shown in FIG. 4, in a solvent that is known to rapidly dissolve patterning layer 64, defining multi-layered structure 362. One solvent for PMMA is dichloromethane. One solvent for ZEP520A is dimethylacetamide. In one implementation, the lift-off process may be performed in an ultrasonic bath at 30-50 kHz to facilitate the lift-off process. Multi-layered structure 362 may be subsequently rinsed with isopropanol.

Figure 6:
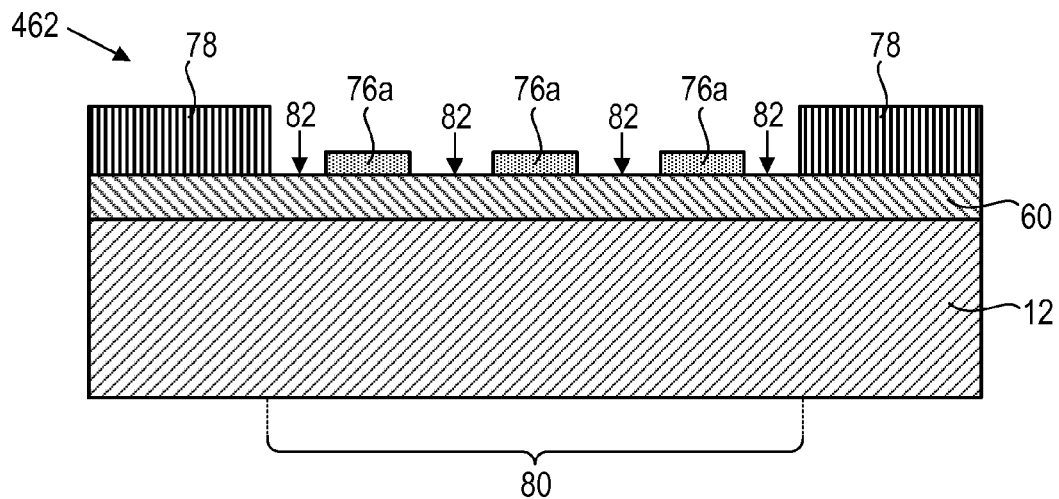
FIG. 6 is a simplified side view of the multi-layered structure shown in FIG. 5 having a resist pattern layer positioned thereon.

Referring to FIG. 6, a resist pattern layer 78 may be positioned on multi-layered structure 362, shown in FIG. 5, defining a multi-layered structure 462. Resist pattern layer 78 defines a region 80 of multi-layered structure 462, region 80 including hard mask material 76a and exposed portions 82 of conducting layer 60. Resist pattern layer 78 may be formed using optical lithography or any other lithography process.

Figure 7:
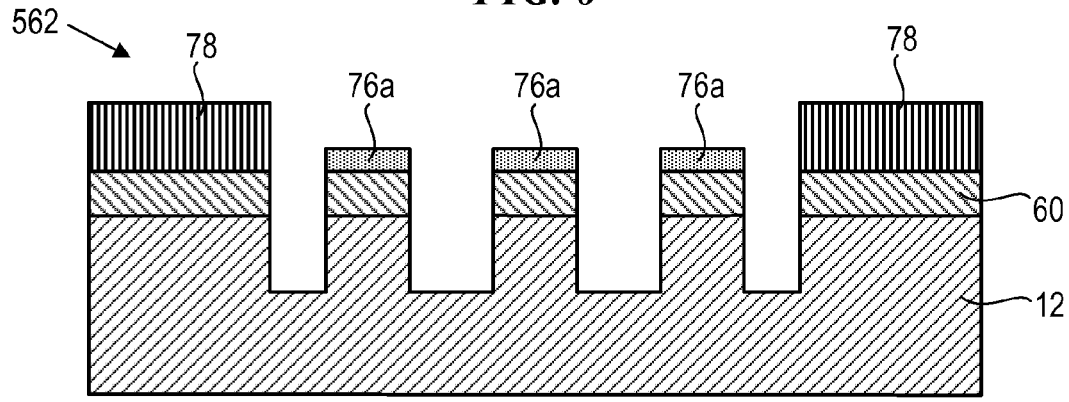
FIG. 7 is a simplified side view of the multi-layered structure shown in FIG. 6 having a pattern of the hard mask material and the resist pattern layer transferred into the conducting layer and the substrate.

Referring to FIG. 7, multi-layered structure 462, shown in FIG. 6, may be subjected to an etching process to transfer the features thereof into substrate 12, defining multi-layered structure 562. More specifically, the pattern of resist pattern layer 78 and hard mask material 76a may be transferred into substrate 12, and thus exposed portions 82 of conducting layer 60, shown in FIG. 6, and portions of substrate 12 in superimposition therewith may be removed. To that end, the etching process may be a dry etch including both single step and multi-step process. In an embodiment, fluorine containing etch chemistries may be employed. Further, conducting layer 60 may be etched with a high selectivity to hard mask material 76a.

In a further embodiment, the etching of conducting layer 60 may be monitored in-situ by measuring a reflectance of exposed portions 82 of conducting layer 60 during etching. This measurement may be performed by focusing a source of light (not shown) onto exposed portions 82 and monitoring light reflected therefrom with a detector (not shown). The reflectance of exposed portions 82 of conducting layer 60 may vary as the thickness $t_2$ of conducting layer 60, shown in FIG. 2, may be reduced by etching thereof. The measured reflectance of exposed portions 82 of conducting layer 60 may exhibit an inflection at a time at which exposed portions 82 of conducting layer 60 may be substantially removed from multi-layered structure 462, shown in FIG. 6, and thus, indicating that the etching process may be removing the now-exposed substrate 12. An in-situ measurement of this inflection time may facilitate precise control of the etch depth into substrate 12.

Figure 8:
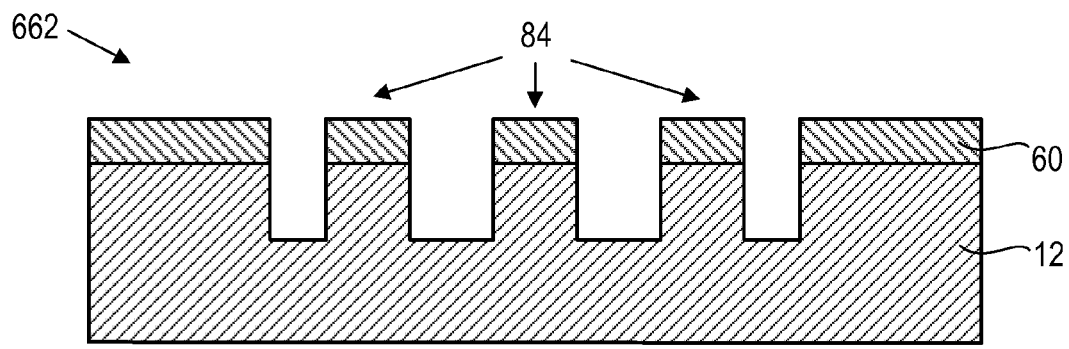
FIG. 8 is a simplified side view of the multi-layered structure shown in FIG. 7 having the hard mask material and the resist pattern layer substantially removed.

Referring to FIG. 8, hard mask material 76a and resist pattern layer 78, both shown in FIG. 7, may be removed, defining multi-layered structure 662 and features 84. A process for removing resist pattern layer 78, shown in FIG. 7, is immersing multi-layered structure 562, shown in FIG. 7, in a hot piranha solution (3 parts $H_2SO_4$ and 1 part $H_2O_2$) for 5 minutes or more. As mentioned previously, one material for hard mask material 76 is chromium, and thus, a method of removing chromium is immersing multi-layered structure 562, shown in FIG. 7, in an aqueous solution comprising ceric ammonium nitrate.

Figure 9:
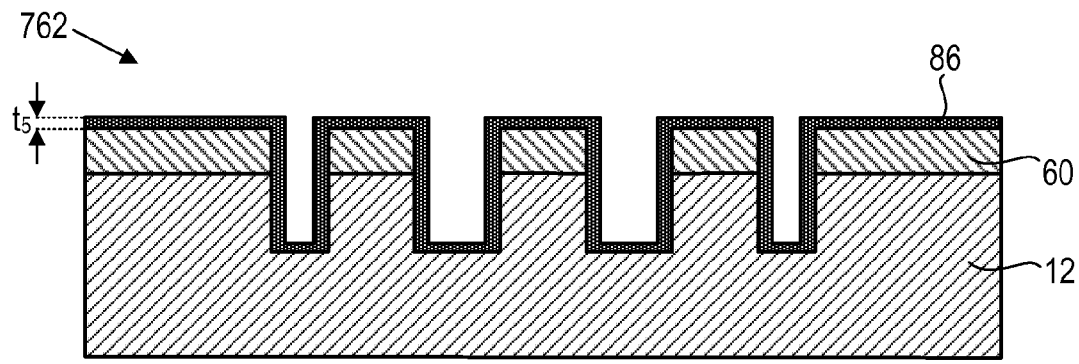
FIG. 9 is a simplified side view of the multi-layered structure shown in FIG. 8 having an adhesion layer deposited thereon.

Referring to FIG. 9, a mesa may be defined on multi-layered structure 662, shown in FIG. 8. To define the mesa, an adhesion layer 86 may be positioned on multi-layered structure 662, shown in FIG. 8, defining a multi-layered structure 762. In one embodiment, adhesion layer 86 may be formed from Cr and may be deposited by methods including, but not limited to, sputtering and evaporation. Adhesion layer 86 may have at thickness $t_5$ having a magnitude of 10-50 nm.

Figure 10:
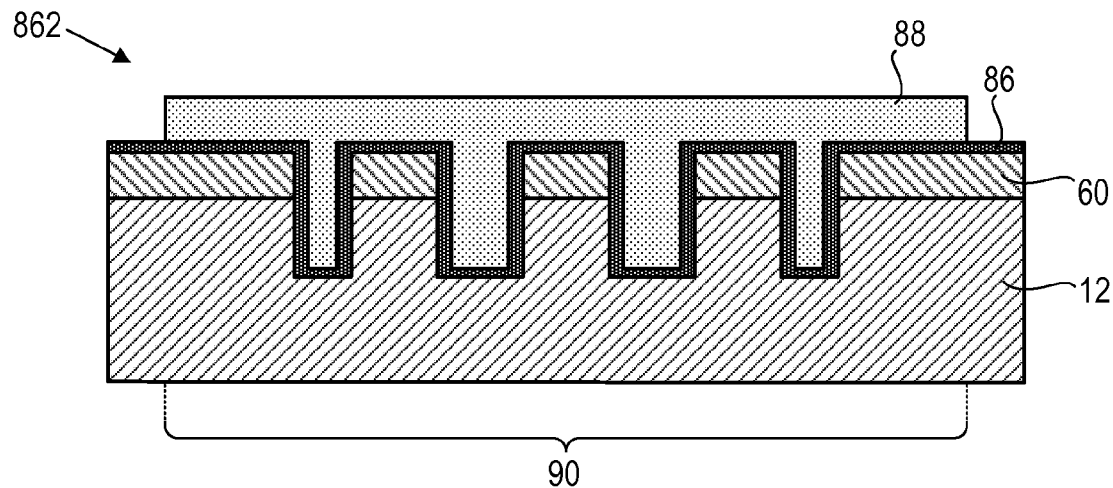
FIG. 10 is a simplified side view of the multi-layered structure shown in FIG. 9 having an imaging layer positioned thereon.

Referring to FIG. 10, an imaging layer 88 may be positioned on multi-layered structure 762, shown in FIG. 9, defining a multi-layered structure 862. More specifically, imaging layer 88 may be positioned on a region 90 of multi-layered structure 862, with region 90 being in superimposition with features 84, shown in FIG. 8. Imaging layer 88 may be formed with optical lithography.

Figure 11:
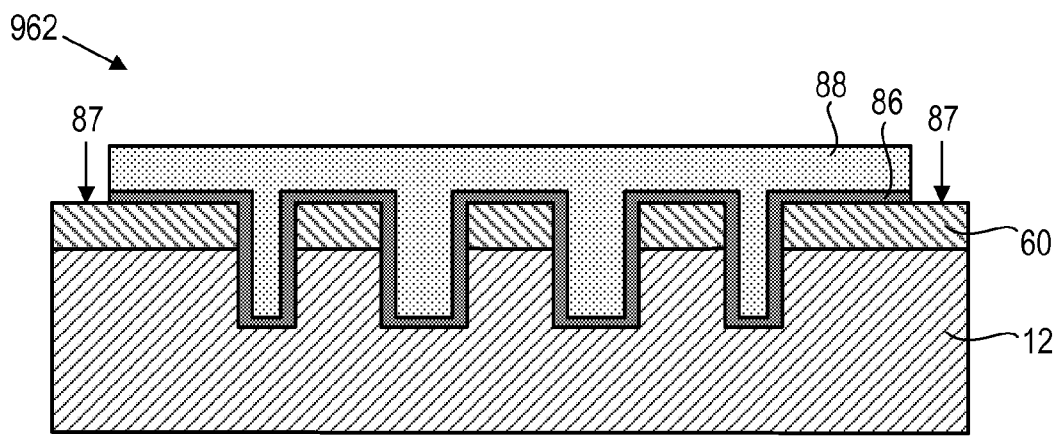
FIG. 11 is a simplified side view of the multi-layered structure shown in FIG. 10 having a pattern of the imaging layer transferred into the adhesion layer.

Referring to FIG. 11, multi-layered structure 862, shown in FIG. 10, may be subjected to an etching process to transfer the pattern of imaging layer 88 into adhesion layer 86, defining multi-layered structure 962, exposing portions 87 of conducting layer 60. As mentioned above, one material for adhesion layer 86 is chromium, and thus, one method for etching chromium is by is a wet etch process that comprises immersing multi-layered structure 862, shown in FIG. 10, in an aqueous solution comprising ceric ammonium nitrate.

Figure 12:
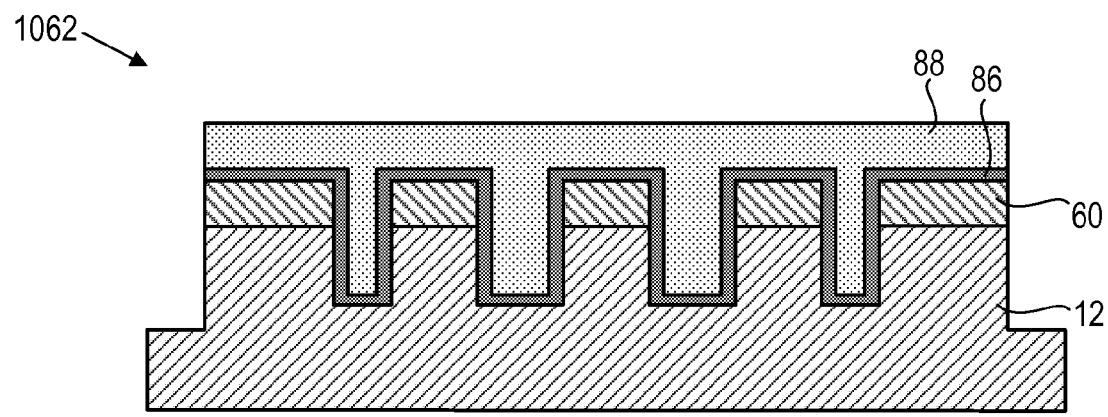
FIG. 12 is a simplified side view of the multi-layered structure shown in FIG. 11 having a pattern of the imaging layer transferred into the substrate.

Referring to FIG. 12, multi-layered structure 962, shown in FIG. 11, may be subjected to an etching process to transfer the pattern of imaging layer 88 and adhesion layer 86 into substrate 12, defining multi-layered structure 1062. Thus, exposed portions 87 of conducting layer 60, shown in FIG. 11, and portions of substrate 12 in superimposition therewith may be removed. One process for etching conducting layer 60 is a dry etch to substantially remove exposed portions of conducting layer 60. One process for etching substrate 12 is a wet etch in an aqueous buffered HF acid solution. However, a wet etch of substrate 12 may result in undercut of substrate 12 under adhesion layer 86 and resist layer 88. Furthermore, in an example, substrate 12 may be etched approximately 15 microns and subsequently rinsed thoroughly in deionized water.

Figure 13:
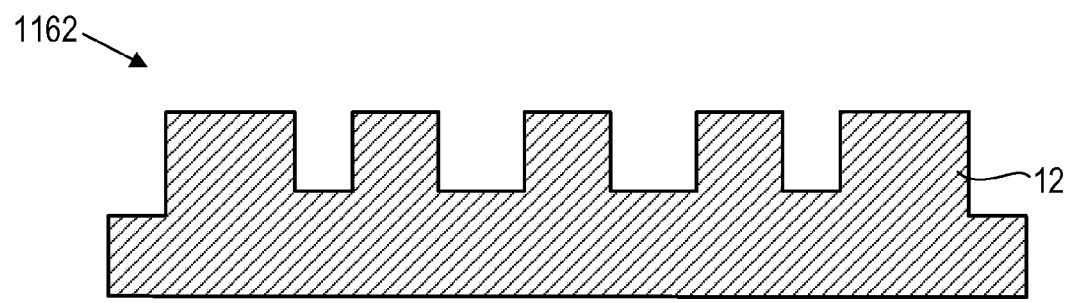
FIG. 13 is a simplified side view of the multi-layered structure shown in FIG. 12 having the conducting layer, the adhesion layer, and the imaging layer substantially removed.

Referring to FIG. 13, imaging layer 88, adhesion layer 86, and conducting layer 60, all shown in FIG. 12, may be removed, defining multi-layered structure 1162. Conducting layer 60 may be removed from substrate 12 with a process that is substantially selective. In an embodiment, conducting layer 60 may be removed employing noble gas halides, such as XeF$_2$, XeF$_4$, XeF$_6$, KrF$_2$, KrF$_4$, and KrF$_6$, as described in U.S. Pat. No. 4,190,488 entitled "Etching Method Using Noble Gas Halides" which is incorporated herein. In a further embodiment, polyatomic halogen fluorides may be employed, as described in U.S. Pat. No. 4,498,953 entitled "Etching Techniques" which is incorporated herein. In one embodiment, XeF$_2$ (xenon difluroide) may be employed as it possesses an immeasurably low etch rate for fused silica (substrate 12). As a result, removal of conducting layer 60 may be performed with extremely high selectivity toward fused silica (substrate 12). In a further embodiment, it may be desired to have conducting layer 60 remain on substrate 12.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of forming a lithographic template, said method comprising:
    creating a multi-layered structure, by (i) forming, on a body, a conducting layer, and (ii) forming on said conducting layer, a patterned layer having protrusions and recessions, said recessions exposing portions of said conducting layer;
    depositing a hard mask material on said multi-layered structure, said deposited hard mask material covering a top surface of said patterned layer and said portions of said conducting layer;
    removing said patterned layer, with said hard mask material remaining on said portions of said conducting layer;
    positioning a resist pattern on said multi-layered structure to define a region of said multi-layered structure; and
    selectively removing portions of said multi-layered structure in superimposition with said region using said hard mask material as an etching mask, wherein selectively removing said portions of said multi-layered structure using said hard mask material as an etching mask comprises removing portions of said conducting layer and said body in a single step.

2. The method as recited in claim 1 further comprising removing said hard mask material and said resist pattern.

3. The method as recited in claim 2 further comprising removing said conducting layer.

4. The method as recited in claim 2 further comprising defining a mesa in said body.

5. The method as recited in claim 2 further comprising positioning an adhesion layer on said multi-layered structure.

6. The method as recited in claim 5 further comprising positioning an imaging layer on said multi-layered structure, defining a mesa pattern, and selectively removing portions of said multi-layered structure using said imaging layer as an etching mask, and removing said imagining layer, said adhesion layer, and said conducting layer.

7. The method as recited in claim 1 wherein said conducting layer comprises a material selected from a set of materials consisting of tantalum, tungsten, molybdenum, titanium, tantalum nitride, tungsten nitride, titanium nitride, molybdenum nitride, tantalum silicide, tungsten silicide, titanium silicide, molybdenum silicide, tantalum silicon nitride, tungsten silicon nitride, titanium silicon nitride, molybdenum silicon nitride, or other refractory metal alloys.

8. The method as recited in claim 1 wherein said conducting layer has a thickness of less than 10 nanometers.

9. The method as recited in claim 1 wherein said hard mask material comprises a material selected from a set of materials consisting of chromium, nickel, platinum, and alloys thereof.

10. The method as recited in claim 3 wherein removing said conducting layer further includes gas-phase etching said conducting layer with a gas selected from a set of gases including xenon difluoride, xenon tetrafluoride, xenon hexafluoride, krypton difluoride, krypton tetrafluoride, krypton hexafluoride, polyatomic halogen fluoride, and a noble gas halide.

11. The method as recited in claim 1 wherein removing said portions of said conducting layer further includes monitoring a reflectance of a light impinged thereon.

12. A method of forming a lithographic template, said method comprising:
    creating a multi-layered structure by (i) forming, on a body, a conducting layer, and (ii) forming on said conducting layer, a patterned layer having protrusions and recessions, said recessions exposing portions of said conducting layer;
    depositing a hard mask material anisotropically on said multi-layered structure, covering a top surface of said patterned layer and said portions of said conducting layer;
    removing said patterned layer by a lift-off process, with said hard mask material remaining on said portions of said conducting layer; and
    selectively removing portions of said multi-layered structure using said hard mask material as an etching mask, wherein selectively removing said portions of said multi-layered structure using said hard mask material as an etching mask comp rises removing portions of said conducting layer and said body in a single step.

13. The method as recited in claim 12 further comprising removing said hard mask material.

14. The method as recited in claim 13 further comprising removing said conducting layer.

15. The method as recited in claim 13 further comprising defining a mesa in said body.

16. The method as recited in claim 13 further comprising positioning an adhesion layer on said multi-layered structure.

17. The method as recited in claim 16 further comprising positioning an imaging layer on said multi-layered structure, defining a mesa pattern, and selectively removing portions of said multi-layered structure using said imaging layer as an etching mask, and removing said imagining layer, said adhesion layer, and said conducting layer.

18. The method as recited in claim 12 wherein said conducting layer comprises a material selected from a set of materials consisting of tantalum, tungsten, molybdenum, titanium, tantalum nitride, tungsten nitride, titanium nitride, molybdenum nitride, tantalum silicide, tungsten silicide, titanium silicide, molybdenum silicide, tantalum silicon nitride, tungsten silicon nitride, titanium silicon nitride, molybdenum silicon nitride, or other refractory metal alloys.

19. The method as recited in claim 12 wherein said conducting layer has a thickness of less than 10 nanometers.

20. The method as recited in claim 12 wherein said hard mask material comprises a material selected from a set of materials consisting of chromium, nickel, and platinum.

21. A method of forming a lithographic template, said method comprising:
    creating a multi-layered structure, by forming, on a body, a conducting layer, and forming on said conducting layer, a patterned layer having protrusions and recessions, said recessions exposing portions of said conducting layer;

depositing a hard mask material anisotropically on said multi-layered structure covering a top surface of said patterned layer and said portions of said conducting layer;

removing said patterned layer by a lift-off process;

positioning a resist pattern on said multi-layered structure to define a region of said multi-layered structure;

selectively removing portions of said multi-layered structure in superimposition with said region using said hard mask material as an etching mask;

removing said hard mask material and said resist pattern;

positioning an adhesion layer on said multi-layered structure; and positioning an imaging layer on said multi-layered structure, defining a mesa pattern, and selectively removing portions of said multi-layered structure using said imaging layer as an etching mask, and removing said imaging layer, said adhesion layer, and said conducting layer.

22. The method as recited in claim 21 wherein said conducting layer comprises a material selected from a set of materials consisting of tantalum, tungsten, molybdenum, titanium, tantalum nitride, tungsten nitride, titanium nitride, molybdenum nitride, tantalum silicide, tungsten silicide, titanium silicide, molybdenum silicide, tantalum silicon nitride, tungsten silicon nitride, titanium silicon nitride, molybdenum silicon nitride, or other refractory metal alloys.

23. The method as recited in claim 21 wherein said conducting layer has a thickness of less than 10 nanometers.

24. The method as recited in claim 22 wherein said hard mask material comprises a material selected from a set of materials consisting of chromium, nickel, platinum, and alloys thereof.

25. The method as recited in claim 21, wherein removing the portions of said multi-layered structure using said hard mask material as an etching mask comprises selectively removing portions of said conducting layer and said body in a single step.

* * * * *